United States Patent
Kumar et al.

(10) Patent No.: US 10,326,477 B2
(45) Date of Patent: Jun. 18, 2019

(54) TECHNIQUES FOR MISCORRECTION DETECTION FOR CONSTITUENT CODEWORDS IN PRODUCT CODES

(71) Applicant: SK Hynix Inc., Gyeonggi-do (KR)

(72) Inventors: Naveen Kumar, San Jose, CA (US); Aman Bhatia, San Jose, CA (US); Yi-Min Lin, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 32 days.

(21) Appl. No.: 15/379,098

(22) Filed: Dec. 14, 2016

(65) Prior Publication Data

US 2017/0194989 A1 Jul. 6, 2017

Related U.S. Application Data

(60) Provisional application No. 62/273,331, filed on Dec. 30, 2015.

(51) Int. Cl.
*H03M 13/13* (2006.01)
*H03M 13/15* (2006.01)
*H03M 13/29* (2006.01)

(52) U.S. Cl.
CPC ... *H03M 13/2909* (2013.01); *H03M 13/1505* (2013.01); *H03M 13/29* (2013.01); *H03M 13/2945* (2013.01); *H03M 13/13* (2013.01); *H03M 13/1515* (2013.01)

(58) Field of Classification Search
CPC ........... H03M 13/618; H03M 13/1137; H03M 13/152; H03M 13/033; H03M 13/2909; H03M 13/1505; H03M 13/13; H03M 13/1515; H03M 13/29
USPC .................................................. 714/763, 755
See application file for complete search history.

(56) References Cited

U.S. PATENT DOCUMENTS

| | | | |
|---|---|---|---|
| 5,691,994 A | 11/1997 | Acosta | |
| 7,747,934 B2 * | 6/2010 | Livshitz | H03M 13/1111 714/800 |
| 8,060,805 B2 * | 11/2011 | Kyung | H03M 13/11 714/752 |
| 8,065,598 B1 * | 11/2011 | Gunnam | H03M 13/116 714/800 |
| 8,762,818 B1 * | 6/2014 | Sun | H03M 13/1525 714/781 |
| 9,559,727 B1 | 1/2017 | Kumar et al. | |
| 2007/0094580 A1 * | 4/2007 | Livshitz | H03M 13/1111 714/779 |
| 2007/0143659 A1 | 6/2007 | Ball | |
| 2009/0217130 A1 * | 8/2009 | Myung | H03M 13/1165 714/752 |

(Continued)

*Primary Examiner* — James C Kerveros
(74) *Attorney, Agent, or Firm* — Kilpatrick Townsend & Stockton LLP

(57) ABSTRACT

Techniques are described for protecting miscorrection in a codeword. In one example, the techniques include obtaining a first set of data to be encoded using a product code comprising one or more constituent codes, and generating a second set of data by performing a miscorrection avoidance procedure on the first set of data. The miscorrection avoidance procedure decreases a probability of miscorrection at a decoder. The techniques further includes jointly encoding the first and the second set of data using an encoding procedure corresponding to the product code to generate at least one encoded codeword, and storing the encoded codeword in the memory.

20 Claims, 11 Drawing Sheets

(56) References Cited

U.S. PATENT DOCUMENTS

| | | |
|---|---|---|
| 2014/0129896 A1 | 5/2014 | Parthasarathy et al. |
| 2014/0351672 A1 | 11/2014 | Parthasarathy et al. |
| 2015/0309875 A1 | 10/2015 | Mittelholzer et al. |
| 2016/0342467 A1 | 11/2016 | Kumar et al. |

* cited by examiner

TECHNIQUES FOR MISCORRECTION DETECTION FOR CONSTITUENT CODEWORDS IN PRODUCT CODES

CROSS-REFERENCE TO RELATED APPLICATIONS

The present application claims priority to Provisional Application No. 62/273,331 entitled "Miscorrection Detection For Constituent Codewords In Product Codes," filed Dec. 30, 2015, which is assigned to the assignee hereof and expressly incorporated by reference herein in its entirety.

TECHNICAL FIELD

The present disclosure relates generally to error correcting codes, and in particular, to improving performance of product codes.

BACKGROUND

Reliability of storage systems such as NAND flash memories may decline as higher storage density is achieved with multi-level cell (MLC)/triple-level cell (TLC) technologies. Error correcting codes (ECC) can be used in storage systems to detect and/or correct errors in the data and increase performance and efficiency of these systems. Several classes of ECC codes exist in the art, such as Bose-Chaudhuri-Hocquenghem (BCH) codes, low density parity check codes (LDPC), turbo product codes (TPC), and the like.

In recent ECC research developments, product codes have shown promising results for their viable application in storage applications, such as NAND flash storage. In addition, in some scenarios, generalized product codes (GPC) have shown to outperform LDPC codes, BCH codes and/or TPC in terms of codeword error rate (CER) performance. Complexity of encoder/decoders for product codes is smaller compared to complexity of encoder/decoders used for LDPC and/or BCH codes. Therefore, product codes are suitable candidates for storage applications. There is a need in the art for methods to improve performance of the product codes.

SUMMARY

In one example, an apparatus for protecting miscorrection is disclosed. The apparatus includes a memory and at least one processor coupled to the memory. The at least one processor configured to obtain a first set of data to be encoded using a product code comprising one or more constituent codes, and generate a second set of data by performing a miscorrection avoidance procedure on the first set of data. The miscorrection avoidance procedure decreases a probability of miscorrection at a decoder. The at least one processor is further configured to jointly encode the first and the second set of data using an encoding procedure corresponding to the product code to generate at least one encoded codeword, and store the encoded codeword in the memory.

In one embodiment, number of bits in the second set of data is determined based on a desired amount of miscorrection protection. In one embodiment, the at least one processor is further configured to perform a plurality of exclusive OR (XOR) operations on one or more sections of the first set of data to generate the second set of data. In another embodiment, the second set of data comprises one or more XOR bits corresponding to a single codeword.

In one embodiment, the first set of data corresponds to information bits corresponding to two or more encoded codewords, wherein the second set of data is included in one of the two or more encoded codewords.

In one embodiment, the at least one processor is further configured to extend a first Galois field corresponding to the product code to a second Galois field and generate the second set of data, wherein each of the bits in the second set of data comprises a parity bit corresponding to one or more of the bits in the first set of data. An order of the second Galois field is greater than an order of the first Galois field.

In one embodiment, at least one of the one or more constituent codes corresponds to Bose-Chaudhuri-Hocquenghem (BCH) codes. Any other error correcting codes may also be used without departing from the teachings of the present disclosure.

In one example, an apparatus for miscorrection protection is disclosed. The apparatus includes a memory and at least one processor coupled to the memory. The at least one processor configured to receive a message comprising a product codeword. The product codeword comprises one or more bits corresponding to a miscorrection avoidance procedure. The at least one processor is further configured to decode the received message using a decoder to generate a candidate decoded codeword, and determine if a miscorrection has happened during the decoding procedure using the one or more bits corresponding to the miscorrection avoidance procedure.

In one embodiment, the at least one processor is further configured to perform a plurality of exclusive OR (XOR) operations on one or more bits of the candidate codeword.

In one example, a method for miscorrection protection is disclosed. The method includes, in part, obtaining a first set of data to be encoded using a product code comprising one or more constituent codes, generating a second set of data by performing a miscorrection avoidance procedure on the first set of data, wherein the miscorrection avoidance procedure decreases a probability of miscorrection at a decoder, jointly encoding the first and the second set of data using an encoding procedure corresponding to the product code to generate at least one encoded codeword, and storing the encoded codeword in the memory.

In one example, a method for miscorrection protection is disclosed. The method includes, in part, receiving a message comprising a product codeword, wherein the product codeword comprises one or more bits corresponding to a miscorrection avoidance procedure, decoding the received message using a decoder to generate a candidate decoded codeword, determining if a miscorrection has happened during the decoding procedure using the one or more bits corresponding to the miscorrection avoidance procedure.

In one example, a non-transitory processor-readable medium for protecting miscorrection is disclosed. The processor-readable instructions configured to cause one or more processors to obtain a first set of data to be encoded using a product code comprising one or more constituent codes, and generate a second set of data by performing a miscorrection avoidance procedure on the first set of data. The miscorrection avoidance procedure decreases a probability of miscorrection at a decoder. The processor-readable instructions are further configured to cause one or more processors to jointly encode the first and the second set of data using an encoding procedure corresponding to the product code to generate at least one encoded codeword, and store the encoded codeword in the memory.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Figure 1:
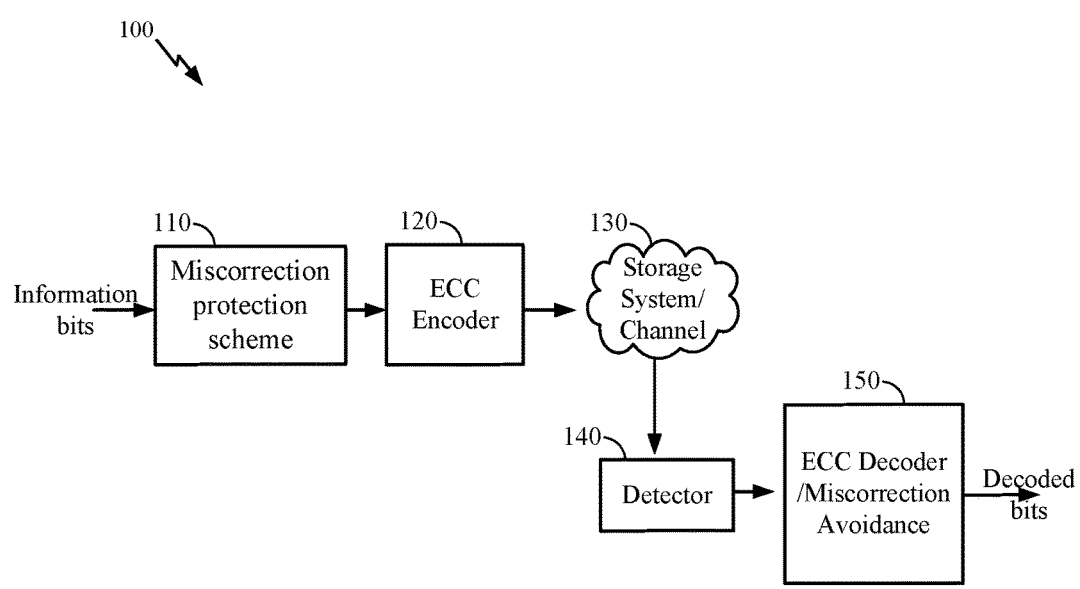
FIG. 1 illustrates an example high level block diagram of an error correcting system with miscorrection protection, in accordance with certain embodiments of the present disclosure.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

The term "error correcting code (ECC)" is used herein to refer to a codeword that is generated by a process of adding redundant data, or parity data, to a message, such that it can be recovered by a receiver even when a number of errors are introduced, either during the process of transmission, or storage. In general, ECC decoding can correct one or more errors up to the capability of the code being used. Error-correcting codes are frequently used in communications, as well as for reliable storage in storage systems such as CDs, DVDs, hard disks, and random access memories (RAMs), flash memories, and the like. Error correcting codes may include turbo product codes (TPC), generalized product codes (GPC), low density parity check codes (LDPC), Bose-Chaudhuri-Hocquenghem (BCH) codes, Reed Solomon codes, and the like.

Turbo product codes are a promising candidate for correcting errors in storage applications. Turbo product codes may include two or more dimensions, each of which corresponding to a class of error correcting codes, such as BCH codes, Reed Solomon codes, or the like. The ECC code corresponding to each dimension of the TPC code is referred to herein as a constituent code. In one example, a two-dimensional TPC codeword may include one or more error correcting codewords (e.g., BCH codewords) corresponding to its first dimension, and one or more error correcting codewords corresponding to its second dimension.

TPC codes may be decoded by performing an iterative decoding procedure on the constituent codewords in one or more dimensions. As an example, for decoding a TPC code with BCH constituent codes, the TPC decoder performs BCH decoding on one or more codewords in the first dimension and one or more codewords in the second dimension of the TPC code. The TPC decoder may iteratively continue the decoding process until either a correct codeword is found or decoding failure is declared.

The term "hard decision" is used herein to refer to a bit that comprises a "0" or a "1" value, and is associated with a particular location within a codeword. A "hard decision" may also be referred to as a "hard output" or "hard information." In some embodiments, the reliability of each hard decision may be known. The "reliability" of a hard decision refers to a probability (e.g., a value from "0" through "1") that the corresponding hard decision is correct. A "reliability" may also be referred to as "soft information" or a "soft output." In a NAND channel, a reliability for each bit may be obtained, for example, by multiple read operations from the NAND memory using different thresholds. In general, if the hard decision decoding of a codeword fails, soft information can be used to decode the failed codeword using soft decoding techniques, such as Chase decoding.

The term "miscorrection" is used herein to refer to the cases in which the received codeword is closer to an incorrect codeword than the correct constituent codeword, which results in a decoding error. In general, probability of miscorrection may be higher when number of errors in the received codeword (e.g., from the NAND flash memory) is large. This may occur, for example, when the soft information is not generated in an optimal manner, or when the distributions of the threshold of the cells in the NAND flash memory are unknown or difficult to determine, or when the NAND flash is close to its end-of-life.

One of the key challenges in designing product codes is reducing the error floor, especially, at high code rates with short code lengths. Storage applications generally have strict requirements for short code lengths and high code rates, therefore, designing suitable codes for these applications is very challenging. In general, one of the main causes of the CER performance degradation in product codes is miscorrections of the constituent codewords in the iterative decoder. Bounded distance decoding of a BCH code ensures that there is no miscorrection when number of errors in the received codeword is less than or equal to correction capability of the BCH code. Miscorrection happens when number of errors in the received codeword is higher than the correction capability of the code (e.g., t). In this case, the decoder may output an incorrect codeword, usually at a distance (2t+1) bits away from the correct codeword. Thus, a code with higher error correction capability has smaller probability of miscorrection. In many applications, BCH codes are designed with large values of t, therefore, miscorrection may not be observed for these codes. However, correction capability of the BCH codes used as constituent codes in a product code is relatively small (e.g., 2, 3, or 4). Therefore, the miscorrection of the constituent codes is generally observed during iterative decoding of the product codes using conventional methods.

Certain embodiments disclose techniques for reducing number of miscorrections in the decoding process of the constituent codes. The disclosed techniques reduce miscorrection probability and provide significant gains in terms of CER performance. It should be noted that while these techniques are disclosed in the context of product codes (with BCH constituent codes), application of the proposed miscorrection avoidance techniques is not limited to product codes. In general, the proposed techniques may be used to reduce miscorrection probability in any code, without departing from the teachings of the present disclosure.

FIG. 1 illustrates an example high level block diagram of an error correcting system with miscorrection protection, in accordance with certain embodiments of the present disclosure. In the example shown, the miscorrection protection scheme 110 is applied to the received information bits before sending them to the ECC encoder 120. The information bits include data which is desired to be stored in a storage system 130 or transmitted in a communications channel. ECC encoded data is output by encoder 120 and is written to storage 130. In various embodiments, storage 130 may include a variety of storage types or media, such as magnetic disk drive storage, Flash storage, etc. In some embodiments, the techniques described herein are employed in a transceiver and instead of being written to or read from storage, the data is transmitted and received over a channel (e.g., wired or wireless). In this case, the errors in the received codeword may be introduced during transmission of the codeword.

When the stored data is requested or otherwise desired (e.g., by an application or a user), detector 140 receives the data from the storage system. The received data may include some noise or errors. Detector 140 performs detection on the received data and outputs decision and/or reliability information corresponding to one or more bits in a codeword. The decision and/or reliability information is passed to ECC decoder/miscorrection avoidance block 150 which performs ECC decoding using the decision and/or reliability information. In one example, a TPC decoder, checks whether or not a miscorrection has happened after decoding of each of the constituent codewords. The decoded bits are passed to the appropriate entity (e.g., the user or application which requested it). With proper encoding, miscorrection protection and decoding, the information bits match the decoded bits.

Figure 2:
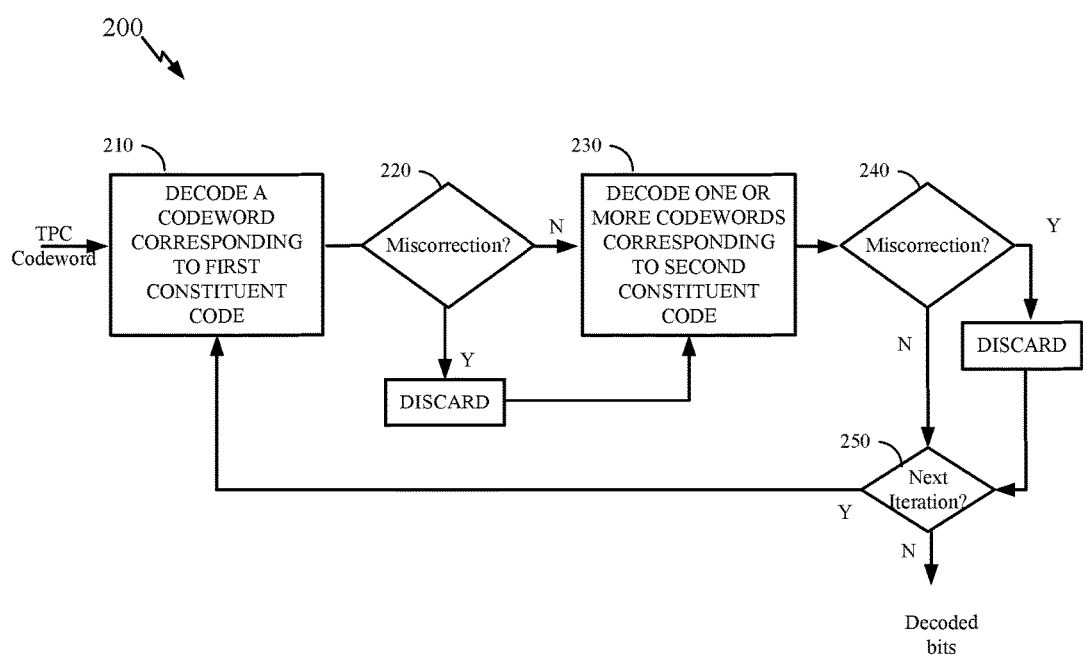
FIG. 2 illustrates an example TPC decoder 200 with miscorrection avoidance, in accordance with certain embodiments of the present disclosure.

FIG. 2 illustrates an example TPC decoder 200 with miscorrection avoidance, in accordance with certain embodiments of the present disclosure. In general, the TPC decoder iteratively performs soft and/or hard decoding on its constituent codes to generate a correct TPC codeword. At 210, the TPC decoder decodes one or more codewords corresponding to a first dimension constituent code (e.g., a row codeword) in a received TPC codeword. In one example, if each of the row constituent codewords is a BCH codeword, the TPC decoder performs BCH decoding (e.g., Chase soft decoding, hard decoding, etc.) on each of the row codewords.

At 220, the decoder checks if a miscorrection has happened during the decoding process. If yes, the decoder discards the decoded constituent codeword. At 230, the decoder decodes one or more codewords corresponding to the second constituent code. For example, the decoder may decode one or more of the M column codewords. In one example, the TPC decoder performs BCH decoding on each of the column codewords. At 240, the decoder checks if a miscorrection has happened during the decoding process. If the decoder detects a miscorrection, it discards the decoded constituent codeword. At 250, the decoder determines if another decoding iteration is needed or not. If a maximum number of iterations has not been reached and a correct codeword is not found, the TPC decoder may perform another iteration to correct the errors.

Certain embodiments disclose several methods to reduce miscorrection probability in decoding of each of the constituent codes. Reduction in miscorrection probability of the constituent codes translates into improvements in decoding performance of the product codes, such as generalized product codes and TPC codes.

In one embodiment, XOR protection is used on one or more constituent codes in a product code in order to reduce miscorrection probability. As an example, before generating BCH parity, m XOR bits are generated from the k data bits. The XOR bits are padded to data bits. Next, the (k+m) bits are encoded using the BCH encoder. When decoding the noisy received codeword, the m-bit XOR is generated for the k bits corresponding to the decoded data. A miscorrection is declared if the m-bit XOR does not match the m bits corresponding to the XOR bit positions output by the decoder.

Figure 3:
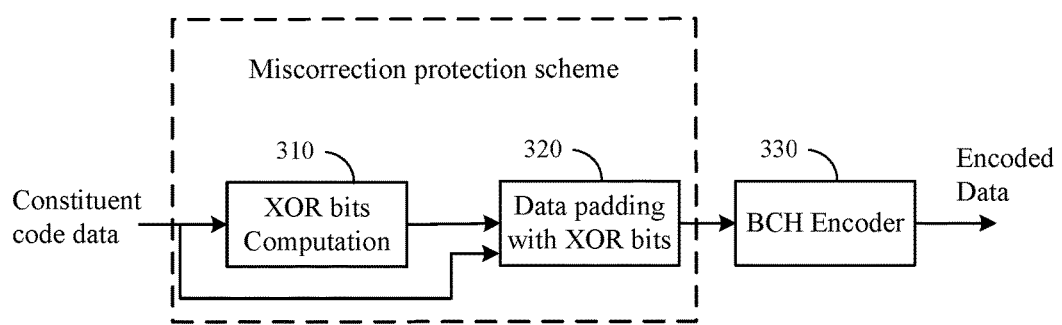
FIG. 3 illustrates an example encoder including the XOR miscorrection protection scheme, in accordance with certain embodiments of the present disclosure.

FIG. 3 illustrates an example encoder including the proposed XOR miscorrection protection scheme, in accordance with certain embodiments of the present disclosure. As illustrated, a device may first receive data corresponding to a constituent code. At 310, the device computes XOR bits associated with data. In one example, the data may be divided into m different sets and XOR operations may be performed on each set of data to calculate the m-bit XOR of data. At 320, the device pads the data with the m XOR bits before constructing the constituent codeword. At 330, the BCH encoder encodes both the received data and the XOR bits to generate the encoded data. While decoding these constituent codewords, the m constraints corresponding to the m XOR bits can be verified to determine whether a correct codeword is found or a miscorrection has happened. The proposed XOR protection scheme identifies the miscorrected codewords when a decoder mistakenly outputs a candidate codeword, which is not a correct codeword. In this case, the XOR bits corresponding to the candidate codeword do not match, therefore a miscorrection is declared.

It should be noted that in the XOR protection technique, the data as well as the XOR bits are protected through code parities. However, any miscorrected bits present in the parity may not protected. However, using the linearity property of the BCH codes, it can be proven by contradiction that it is not possible to have all the error bits in parity region and decode to a correct BCH codeword.

In one embodiment, XOR protection can be shared across one or more constituent codes. For example, in order to reduce XOR parity overhead, two or more (e.g., l) constituent codewords may be encoded simultaneously. In this example, two or more constituent codewords may share the m XOR bits, as described above. It should be noted that the shared XOR protection scheme provides parity overhead savings compared to the XORE protection scheme. However, shared XOR protection scheme may introduce some decoding latency overhead in the decoder.

Figure 4A:
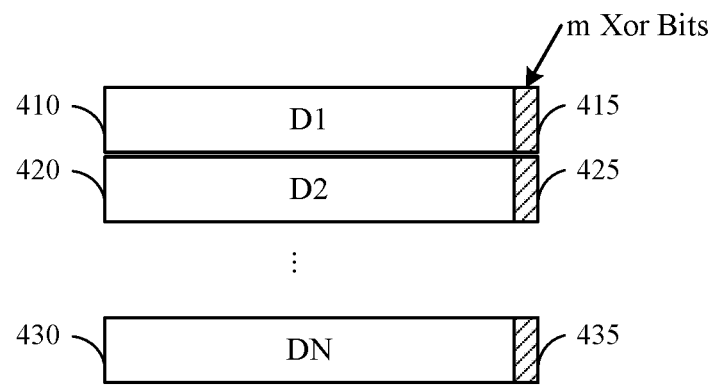
FIGS. 4A and 4B illustrate example constituent codewords with XOR protection, in accordance with certain embodiments of the present disclosure.
Figure 4B:
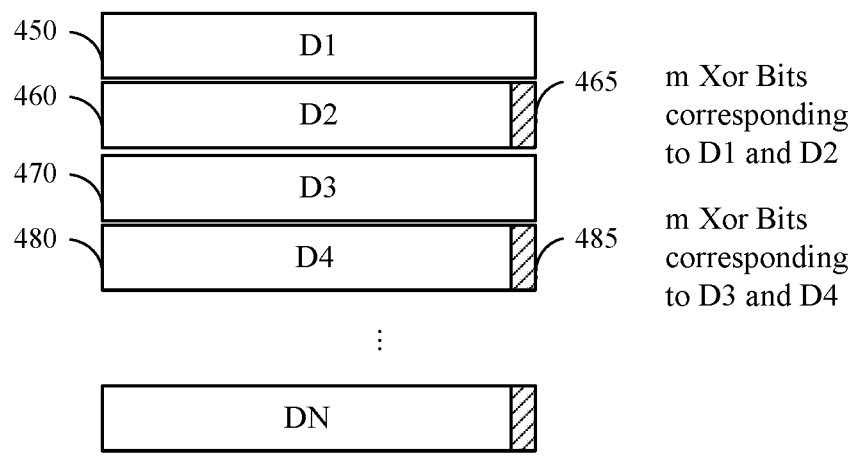

FIGS. 4A and 4B illustrate example constituent codewords with XOR protection, in accordance with certain embodiments of the present disclosure. FIG. 4A illustrates m-bit XOR protection on each of the constituent codewords. In this example, constituent codeword 410 is padded with m XOR bits 415. Similarly, each of the constituent codewords 420 and 430 are padded with m XOR bits 425 and 435, respectively. In the XOR protection technique, m bit overhead is added to the storage requirements for storing the m-XOR bits per constituent codeword.

FIG. 4B illustrates shared XOR protection across two constituent codewords. As illustrated, constituent codewords 450 and 460 share the m XOR bits 465. Similarly, constituent codewords 470 and 480 share the m XOR bits 485. It should be noted that in this example, only two codewords share each m XOR bits. However, in general, any number of codewords (e.g., l) can share the XOR bits without departing from the teachings of the present disclosure. In the shared XOR protection, XOR bits are computed for all the data bits belonging to l different constituent codewords together. In FIG. 4B, the XOR bits are generated with l=2. If m is assumed to be equal to 2, two XOR bits are calculated based on two consecutive constituent codewords. The two XOR bits are padded with the data bits and encoded with every other constituent codeword (e.g., corresponding to D2, D4, . . . ).

In one example, when one of the two constituent codewords that share the XOR protection miscorrects during iterative decoding of the product code, the XOR-bits generated from the decoded data bits will not match the XOR-bits from the decoder output and thus miscorrection will be detected correctly (true positive).

It should be noted that in shared XOR protection, in order to decode first constituent codeword, the second constituent codeword should also get decoded before XOR protection can be verified. Thus, shared XOR protection scheme reduces the hardware overhead to detect the miscorrection of these constituent codewords by trading off the decoding latency and performance. Therefore, a large value of l can lead to longer decoding latency and CER performance loss with increased parity savings and vice versa. The value of l is usually optimized to meet product requirements. In one embodiment, hardware implementations may include multiple decoder units that can run in parallel to improve latency of the shared XOR protection scheme.

In one embodiment, Galois field extension may be performed on constituent codes to provide miscorrection protection for the codes. For example, after code parameters for constituent codes are determined, a Galois field extension may be applied to the constituent code to generate parities on a higher field. As an example, a constituent code is constructed on $GF(2^{10})$ with correction capability (t) equal to three. The same code length with longer shortening can be applied on $GF(2^{11})$ at same level of correction capability t (e.g., 3). In this example, the new code in extended Galois field has a miscorrection probability that is one tenth of the miscorrection probability of the original code. Also, overhead of the Galois field extension scheme in this example is only three bits per BCH codeword. In this example, 33 (=3×11) parity bits will be needed for the proposed code instead of 30 (=3×10) bits for the original code in order to provide better miscorrection protection.

Consider a constituent code with parameters (n, k, t, $2^P$), where n is the codeword length, k is the data length, t is the correction capability and $2^P$ is the order of GF ($2^P$). An extension on the constituent code can be applied to construct a new code with parameters (n+t, k, t, $2^{P+1}$). The correction capability of this new code is same as before. However, there are t bits of parity overhead in the new extended code. In addition, the shortening length is equal to ($2^{P+1}$-n-t). During decoding, any bit corrected by the decoder but present in the shortening region indicates a miscorrection.

Figure 5:
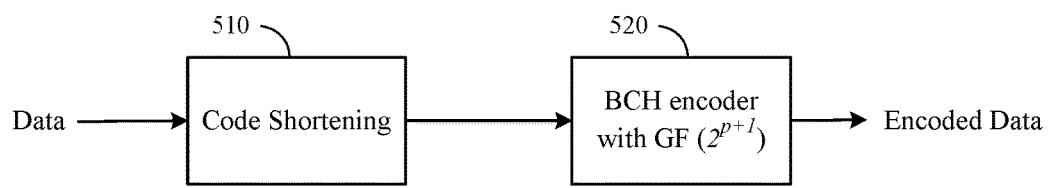
FIG. 5 illustrates an example encoder with Galois field extension for miscorrection protection, in accordance with certain embodiments of the present disclosure.

FIG. 5 illustrates an example encoder with Galois field extension for miscorrection protection, in accordance with certain embodiments of the present disclosure. As illustrated, at 510, code shortening may be performed on the data before encoding to extend the Galois field of the code. At 520, the BCH encoder may encode the shortened data using a $GF(2^{P+1})$ to generate the encoded data.

Figure 6:
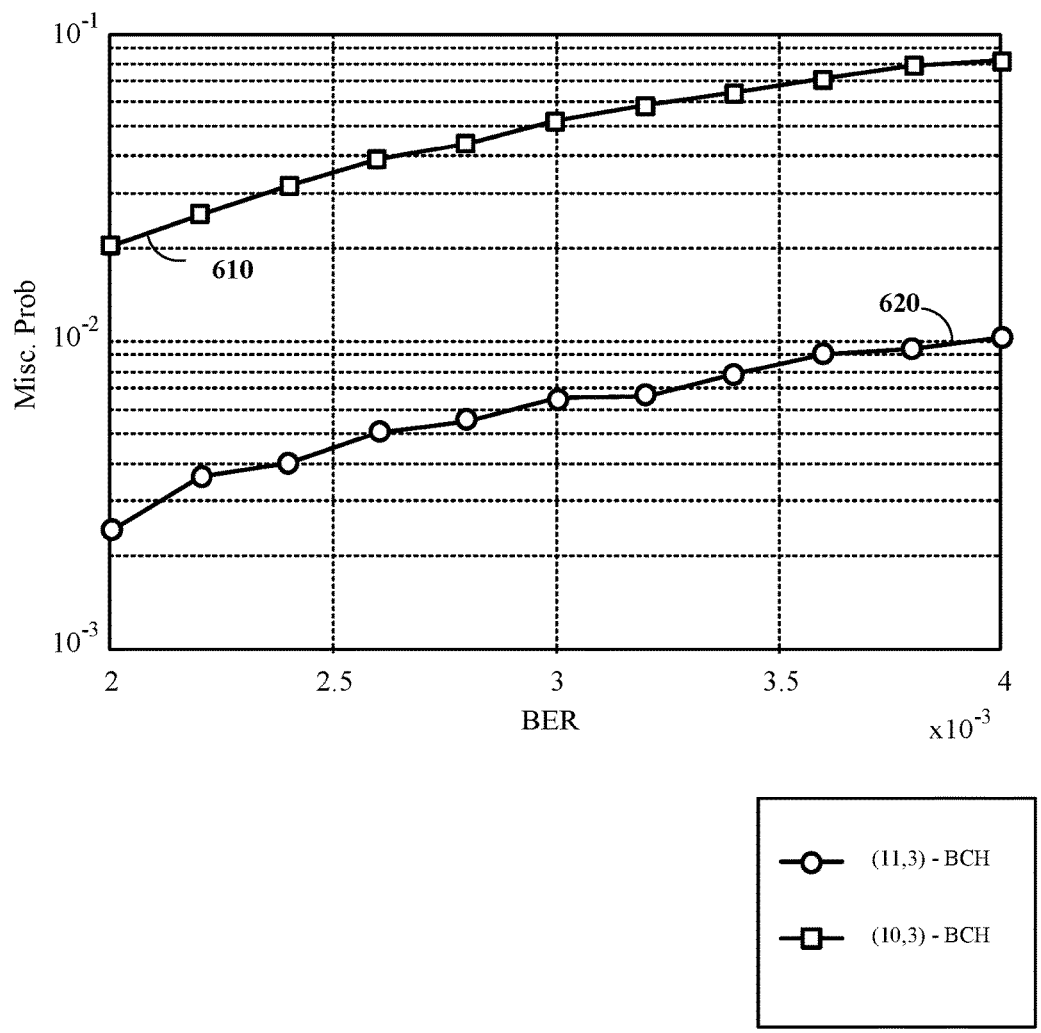
FIG. 6 illustrates an example comparison between miscorrection probabilities of a decoder with and without miscorrection detection, in accordance with certain embodiments of the present disclosure.

FIG. 6 illustrates an example comparison between miscorrection probabilities of a decoder with and without miscorrection detection, in accordance with certain embodiments of the present disclosure. In this example, Galois field extension is used on a BCH code. In this figure, curve 610 illustrates miscorrection probability of a (10, 3) BCH code with t=3, $2^P=2^{10}$. In addition, curve 620 illustrates miscorrection probability of a (11, 3) BCH code with t=3, $2^P=2^{11}$, which is generated by Galois field extension of the (10, 3) BCH code. As can be seen, Galois field extension of the code provides ten times reduction in the miscorrection probability in the BCH constituent code.

Figure 7:
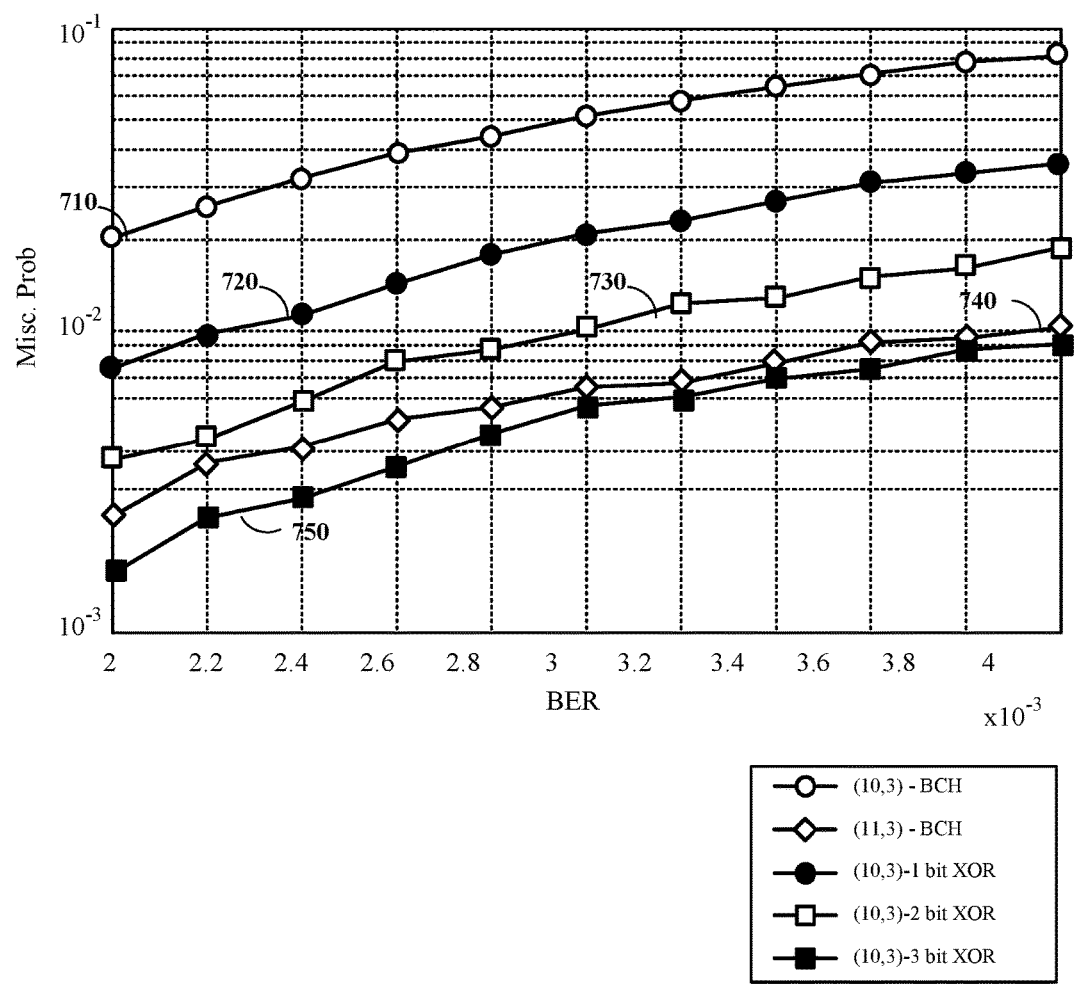
FIG. 7 illustrates an example comparison between miscorrection probabilities of an example BCH code with different miscorrection avoidance schemes, in accordance with certain embodiments of the present disclosure.

FIG. 7 illustrates an example comparison between miscorrection probabilities of an example BCH code with different miscorrection avoidance schemes, in accordance with certain embodiments of the present disclosure. In this figure, curve 710 illustrates miscorrection probability of a (10, 3) BCH code without any miscorrection protection. Curve 720 illustrates miscorrection probability of a (10, 3) BCH code with 1-bit XOR protection. Curve 730 illustrates miscorrection probability of a (10, 3) BCH code with 2-bit XOR protection. Curve 740 illustrates miscorrection probability of a (11, 3) BCH code corresponding to the Galois field extension miscorrection protection scheme. Curve 750 illustrates miscorrection probability of a (10, 3) BCH code with 3-bit XOR protection. As can be seen, the 3-bit XOR protection (e.g., curve 750) and (11, 3) BCH code corresponding to Galois field extension (curve 720) perform better than the other methods by protecting the constituent codes from miscorrection. It should be noted that performance of 3-bit XOR protection (e.g., curve 750) is better than the performance of (11, 3) BCH code corresponding to Galois field extension (curve 720), with similar overhead. Both curves 720 and 750 correspond to 3-bit parity overhead compared to the original (10, 3) BCH code without any miscorrection protection (curve 710).

Figure 8:
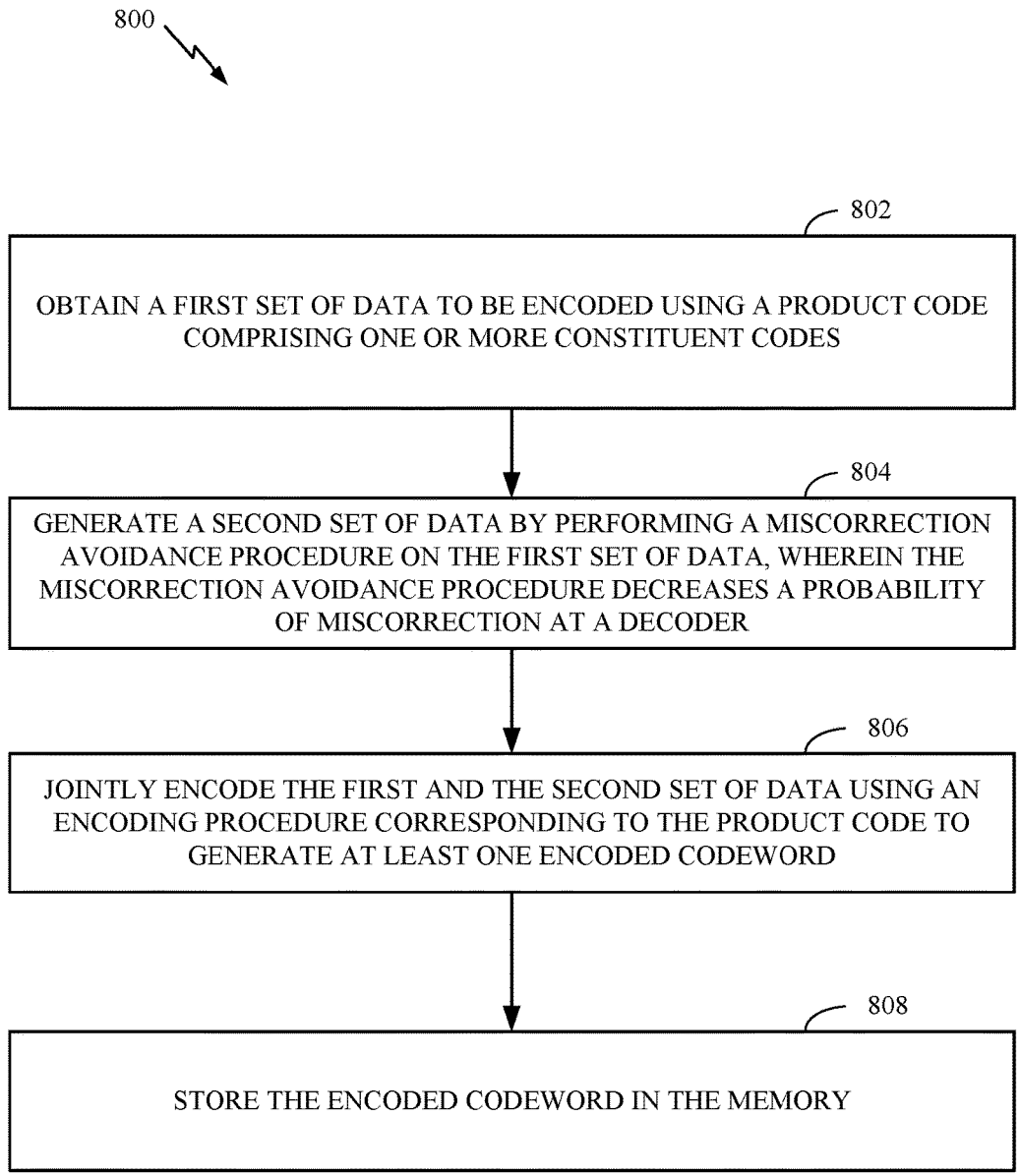
FIG. 8 illustrates example operations that may be performed by a device to avoid miscorrections, in accordance with certain embodiments of the present disclosure.

FIG. 8 illustrates example operations that may be performed by a device to avoid miscorrections, in accordance with certain embodiments of the present disclosure. At 802, the device obtains a first set of data to be encoded using a product code comprising one or more constituent codes. At 804, the device generates a second set of data by performing a miscorrection avoidance procedure on the first set of data. The miscorrection avoidance procedure decreases a probability of miscorrection at a decoder. At 806, the device encodes the first and the second set of data using an encoding procedure corresponding to the product code to generate at least one encoded codeword. At 808, the device stores the encoded codeword in the memory.

In one embodiment, number of bits in the second set of data is determined based on a desired amount of miscorrection protection. In one example, the number of bits in the second set of data may be equal to 1, 2, or 3 bits. In general, number of bits in the second set of data may be any integer, without departing from the teachings of the present disclosure.

In one embodiment, one or more of the miscorrection protection schemes presented here (e.g., XOR protection scheme, shared XOR protection scheme and Galois field extension scheme) can be used in a system without departing from the teachings of the present disclosure. The miscorrection protection scheme may be selected based on parameters of the system. For example, in the examples described corresponding to FIG. 7, if the system can tolerate three bits of overhead on each constituent code, the 3-bit XOR protection may be used. In another example, if the system can only tolerate one bit overheard on each constituent code, either a 1-bit XOR protection can be used or a shared XOR protection on three constituent codes may be used in which 3-bit XOR is shared among three constituent codes.

Figure 9A:
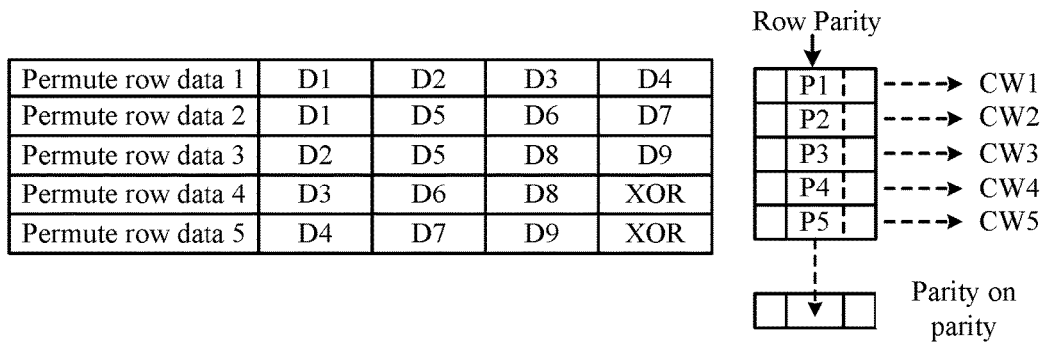
FIGS. 9A-9B illustrate simplified schematic diagrams of a generalized product code (GPC) with XOR miscorrection protection, in accordance with certain embodiments of the present invention.
Figure 9B:
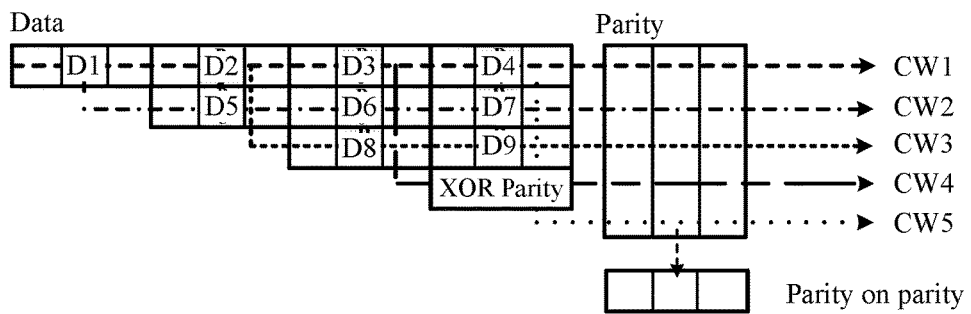

FIGS. 9A-9B illustrate simplified schematic diagrams of a generalized product code (GPC) with shared XOR miscorrection protection, in accordance with certain embodiments of the present invention. The GPC is a product code in which information bits are grouped in blocks; the blocks of information bits and one or more XOR parity blocks are arranged in a rectangular matrix of data blocks. As illustrated in FIG. 9A, the data blocks of information bits are numbered D1-D9, and each block Dk contains I bits, where I is a positive integer. Each row data is permuted and the codeword parity is constructed on the permuted data, which is shown as Row Parity in FIG. 9A. For example, codeword CW1 includes data blocks D1, D2, D3, and D4, as well as parity block P1 constructed corresponding these data blocks. Similarly, codeword CW2 includes data blocks D1, D5, D6, and D7, as well as parity block P2 constructed from these data blocks. Codeword CW3 includes data blocks D2, D5, D8, and D9, and parity block P3. Codeword CW4 includes data blocks D3, D6, D8, and XOR Parity, as well as parity block P4. Codeword CW5 includes data blocks D4, D7, D9, and XOR Parity, as well as parity block P5. In addition, the parities on the parity (POP) are constructed by combining row parities P1-P5 column-wise. The specific arrangement in GPC codes and the XOR data blocks help protect the code from miscorrections. All the data blocks are protected twice; however, the row parity is protected once. The parity on parity (POP) will add another level of protection to remove errors in parities.

FIG. 9B illustrates an example illustrating construction of the GPC code, in accordance with certain embodiments of the present disclosure. In FIG. 9B, the number of data bits in a block, I, is an integer (e.g., 8). However, I can, in general, have any value depending upon desired data length and code rate. $N_{cw}$ represents number of row codewords, which is equal to five in FIG. 9B, i.e., there are five codewords designated as CW1-CW5. In some embodiments, as shown in FIG. 9B, data blocks D1-D9 are arranged in a triangular matrix, with D1-D4 in the first row, D5-D7 in the second row, and D8 and D9 in the third row. The block designated as "XOR" or "XOR parity" is constructed by taking XOR of some or all of data blocks D1-D9. The five codewords CW1-CW5 can be constructed by following the dotted arrow lines leading to each codeword. For example, codeword CW1 includes data blocks D1, D2, D3, and D4. Codeword CW2 includes data blocks D1, D5, D6, and D7. Codeword CW3 includes data blocks D2, D5, D8, and D9. Codeword CW4 includes data blocks D3, D6, D8, and XOR Parity. Codeword CW5 includes data blocks D4, D7, D9, and XOR Parity.

In some embodiments, multiple XOR blocks can be formed, with each XOR block constructed based on a subset of all data blocks of information bits. In one embodiment, length of the "XOR parity" block is equal to I. In this code construction, the decoding process is declared to be successful if all New codewords are decodable and XOR parity check is satisfied. This decoding criterion helps in to protect the GPC code from miscorrections.

Figure 10:
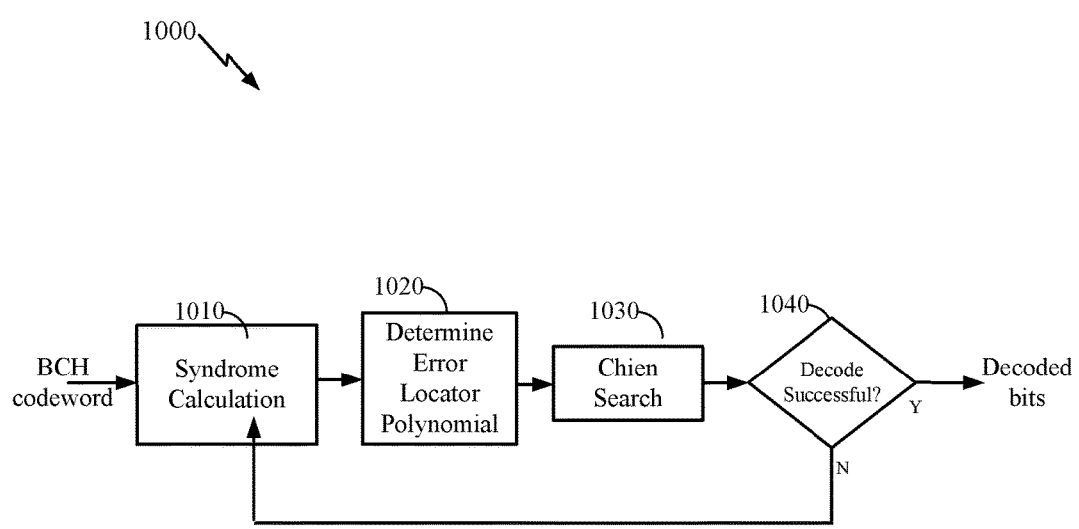
FIG. 10 illustrates an example hard decision Bose-Chaudhuri-Hocquenghem (BCH) decoder, in accordance with certain embodiments of the present disclosure.

FIG. 10 illustrates an example hard decision BCH decoder 1000, in accordance with certain embodiments of the present disclosure. As illustrated, the decoder receives a BCH codeword (e.g., a constituent codeword in a TPC and/or GPC code), and starts an iterative decoding process. For each iteration, BCH decoder performs syndrome calculation (step 1010) on the received codeword, determines error locator polynomial (step 1020), and performs Chien search or similar procedures to determine roots of error locator polynomial (step 1030). Roots of the error locator polynomial provide an indication of where the errors in the codeword are located. The decoder may then correct the errors to generate a candidate codeword. At 1040, the decoder checks if the decoding process has resulted in a correct codeword. In one embodiment, the decoder checks if the candidate codeword is a "miscorrected" codeword using one of the methods presented herein. If the candidate codeword is a correct codeword, the decoder outputs the decoded bits. If not, the decoder may generate a bit flipping pattern, flip one or more bits of the codeword based on the pattern and calculate syndrome values of the new codeword. The decoding process may continue until a correct codeword is found and/or a predetermined maximum number of iterations is reached.

Figure 11:
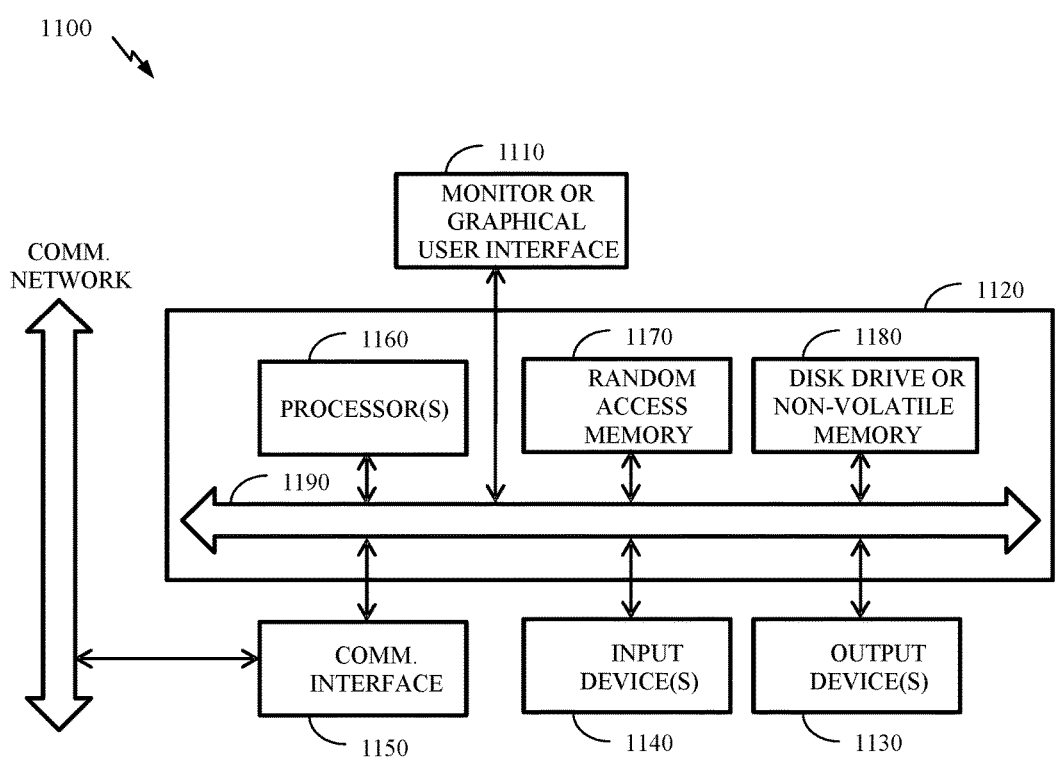
FIG. 11 describes one potential implementation of a device which may be used to encode and/or decode a product code, according to one embodiment.

FIG. 11 describes one potential implementation of a device which may be used to encode and/or decode a product code, according to one embodiment. FIG. 11 is merely illustrative of an embodiment incorporating the present invention and does not limit the scope of the invention as recited in the claims. One of ordinary skill in the art would recognize other variations, modifications, and alternatives. In one embodiment, computer system 1100 typically includes a monitor 1110, a computer 1120, user output devices 1130, user input devices 1140, communications interface 1150, and the like.

As shown in FIG. 11, computer 1120 may include a processor(s) 1160 that communicates with a number of peripheral devices via a bus subsystem 1190. These peripheral devices may include user output devices 1130, user input devices 1140, communications interface 1150, and a storage subsystem, such as random access memory (RAM) 1170 and disk drive 1180.

User input devices 1130 include all possible types of devices and mechanisms for inputting information to computer system 1120. These may include a keyboard, a keypad, a touch screen incorporated into the display, audio input devices such as voice recognition systems, microphones, and other types of input devices. In various embodiments, user input devices 1130 are typically embodied as a computer mouse, a trackball, a track pad, a joystick, wireless remote, drawing tablet, voice command system, eye tracking system, and the like. User input devices 1130 typically allow a user to select objects, icons, text and the like that appear on the monitor 1110 via a command such as a click of a button or the like.

User output devices 1140 include all possible types of devices and mechanisms for outputting information from computer 1120. These may include a display (e.g., monitor 1110), non-visual displays such as audio output devices, etc.

Communications interface 1150 provides an interface to other communication networks and devices. Communications interface 1150 may serve as an interface for receiving data from and transmitting data to other systems. Embodiments of communications interface 1150 typically include an Ethernet card, a modem (telephone, satellite, cable, ISDN), (asynchronous) digital subscriber line (DSL) unit, FireWire interface, USB interface, and the like. For example, communications interface 1150 may be coupled to a computer network, to a FireWire bus, or the like. In other embodiments, communications interfaces 1150 may be physically integrated on the motherboard of computer 1120, and may be a software program, such as soft DSL, or the like.

In various embodiments, computer system 1100 may also include software that enables communications over a network such as the HTTP, TCP/IP, RTP/RTSP protocols, and the like. In alternative embodiments of the present invention, other communications software and transfer protocols may also be used, for example IPX, UDP or the like. In some embodiments, computer 1120 includes one or more Xeon microprocessors from Intel as processor(s) 1160. Further, one embodiment, computer 1120 includes a UNIX-based operating system.

RAM 1170 and disk drive 1180 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. RAM 1170 and disk drive 1180 may be configured to store the basic programming and data constructs that provide the functionality of the present invention.

Software code modules and instructions that provide the functionality of the present invention may be stored in RAM 1170 and disk drive 1180. These software modules may be executed by processor(s) 1160. RAM 1170 and disk drive 1180 may also provide a repository for storing data used in accordance with the present invention.

RAM 1170 and disk drive 1180 may include a number of memories including a main random access memory (RAM) for storage of instructions and data during program execution and a read only memory (ROM) in which fixed non-transitory instructions are stored. RAM 1170 and disk drive 1180 may include a file storage subsystem providing persistent (non-volatile) storage for program and data files. RAM 1170 and disk drive 1180 may also include removable storage systems, such as removable flash memory.

Bus subsystem 1190 provides a mechanism for letting the various components and subsystems of computer 1120 communicate with each other as intended. Although bus subsystem 1190 is shown schematically as a single bus, alternative embodiments of the bus subsystem may utilize multiple busses.

FIG. 11 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An apparatus for protecting miscorrection, comprising:
a memory;
at least one processor coupled to the memory, the at least one processor configured to:
obtain a first set of data to be encoded in a first constituent codeword of a product code associated with a first Galois field, the first set of data comprising a data bit to be further encoded in a second constituent codeword of the product code;

generate a second set of data by performing a miscorrection avoidance procedure on the first set of data, wherein the miscorrection avoidance procedure decreases a probability of miscorrection at a decoder, wherein the miscorrection indicates that a number of errors in the first constituent codeword is higher than a correction capability of the product code, wherein the miscorrection avoidance procedure comprises at least one of:

performing one or more exclusive OR (XOR) operations on the first set of data to generate at least an additional data bit and generating the first constituent codeword by protecting the first set of data and the additional data bit with parity bits, wherein the first constituent codeword generated based on the one or more XOR operations comprises the first set of data, the additional data bit, and the parity bits, or extending the first Galois field corresponding to the product code to a second Galois field, wherein an order of the second Galois field is greater than an order of the first Galois field, wherein the first constituent codeword generated based on the extending of the first Galois field comprises the first set of data and an additional parity bit that corresponds to the order of the second Galois field;

generate the first constituent codeword based on performing the miscorrection avoidance procedure;

generate the second constituent codeword that protects the data bit included in the first set of data of the first constituent codeword; and store the first constituent codeword and the second constituent codeword in the memory.

2. The apparatus of claim 1, wherein a number of bits in the second set of data is determined based on a desired amount of miscorrection protection.

3. The apparatus of claim 1, wherein the miscorrection avoidance procedure comprises performing the one or more XOR operations on a third set of data to be encoded in a third constituent codeword of the product code, wherein the additional data bit is included in the first constituent codeword but not the third constituent codeword.

4. The apparatus of claim 3, wherein the second set of data comprises one or more XOR bits corresponding to a single codeword.

5. The apparatus of claim 3, wherein the first set of data corresponds to information bits corresponding to two or more encoded codewords, wherein the second set of data is included in one of the two or more encoded codewords.

6. The apparatus of claim 1, wherein each of the bits in the second set of data comprises a parity bit corresponding to one or more of the bits in the first set of data.

7. The apparatus of claim 1, wherein the first constituent codeword corresponds to Bose-Chaudhuri-Hocquenghem (BCH) codes.

8. An apparatus for miscorrection protection, comprising:
a memory; and
at least one processor coupled to the memory, the at least one processor configured to:
receive a message comprising a product codeword associated with a first Galois field, wherein the product codeword comprises a first constituent codeword corresponding to a miscorrection avoidance procedure, wherein the miscorrection avoidance procedure comprises at least one of:

performing one or more exclusive OR (XOR) operations on a first set of data to generate at least an additional data bit and generating the first constituent codeword by protecting the first set of data and the additional data bit with parity bits, wherein the first constituent codeword generated based on the one or more XOR operations comprises the first set of data, the additional data bit, and the parity bits, or extending the first Galois field corresponding to the product codeword to a second Galois field, wherein an order of the second Galois field is greater than an order of the first Galois field, wherein the first constituent codeword generated based on the extending of the first Galois field comprises the first set of data and an additional parity bit that corresponds to the order of the second Galois field;

decode the received message using a decoder to generate a candidate decoded codeword;

determine if a miscorrection has happened during the decoding using one or more bits corresponding to the miscorrection avoidance procedure, wherein the miscorrection indicates that a number of errors in the received message is higher than a correction capability of the product codeword.

9. The apparatus of claim 8, wherein the at least one processor is further configured to perform a plurality of exclusive OR (XOR) operations on one or more bits of the candidate decoded codeword.

10. A method for protecting miscorrection, comprising:
obtaining a first set of data to be encoded in a first constituent codeword of a product code associated with a first Galois field, the first set of data comprising a data bit to be further encoded in a second constituent codeword of the product code;

generating a second set of data by performing a miscorrection avoidance procedure on the first set of data, wherein the miscorrection avoidance procedure decreases a probability of miscorrection at a decoder, wherein the miscorrection indicates that a number of errors in the first constituent codeword is higher than a correction capability of the product code, wherein the miscorrection avoidance procedure comprises at least one of:

performing one or more exclusive OR (XOR) operations on the first set of data to generate at least an additional data bit and generating the first constituent codeword by protecting the first set of data and the additional data bit with parity bits, wherein the first constituent codeword generated based on the one or more XOR operations comprises the first set of data, the additional data bit, and the parity bits, or extending the first Galois field corresponding to the product code to a second Galois field, wherein an order of the second Galois field is greater than an order of the first Galois field, wherein the first constituent codeword generated based on the extending of the first Galois field comprises the first set of data and an additional parity bit that corresponds to the order of the second Galois field;

generating the first constituent codeword based on performing the miscorrection avoidance procedure;

generating the second constituent codeword that protects the data bit included in the first set of data of the first constituent codeword; and storing the first constituent codeword and the second constituent codeword in a memory.

11. The method of claim 10, wherein a number of bits in the second set of data is determined based on a desired amount of miscorrection protection.

12. The method of claim 10, wherein the miscorrection avoidance procedure comprises performing the one or more XOR operations on a second set of data to be encoded in a third constituent codeword of the product code, wherein the additional data bit is included in the first constituent codeword but not the third constituent codeword.

13. The method of claim 12, wherein the second set of data comprises one or more XOR bits corresponding to a single codeword.

14. The method of claim 12, wherein the first set of data corresponds to information bits corresponding to two or more encoded codewords, wherein the second set of data is included in one of the two or more encoded codewords.

15. The method of claim 10, wherein each of the bits in the second set of data comprises a parity bit corresponding to one or more of the bits in the first set of data.

16. A method for miscorrection protection, comprising:
receiving a message comprising a product codeword associated with a first Galois field, wherein the product codeword comprises a first constituent codeword corresponding to a miscorrection avoidance procedure, wherein the miscorrection avoidance procedure comprises at least one of:
performing one or more exclusive OR (XOR) operations on a first set of data to generate at least an additional data bit and generating the first constituent codeword by protecting the first set of data and the additional data bit with parity bits, wherein the first constituent codeword generated based on the one or more XOR operations comprises the first set of data, the additional data bit, and the parity bits, or
extending the first Galois field corresponding to the product codeword to a second Galois field, wherein an order of the second Galois field is greater than an order of the first Galois field, wherein the first constituent codeword generated based on the extending of the first Galois field comprises the first set of data and an additional parity bit that corresponds to the order of the second Galois field;
decoding the received message using a decoder to generate a candidate decoded codeword;
determining if a miscorrection has happened during the decoding using one or more bits corresponding to the miscorrection avoidance procedure, wherein the miscorrection indicates that a number of errors in the received message is higher than a correction capability of the product codeword.

17. The method of claim 16, further comprising:
performing a plurality of exclusive OR (XOR) operations on one or more bits of the candidate decoded codeword.

18. A non-transitory processor-readable medium for protecting miscorrection, comprising processor-readable instructions configured to cause one or more processors to:
obtain a first set of data to be encoded in a first constituent codeword of a product code associated with a first Galois field, the first set of data comprising a data bit to be further encoded in a second constituent codeword of the product code;
generate a second set of data by performing a miscorrection avoidance procedure on the first set of data, wherein the miscorrection avoidance procedure decreases a probability of miscorrection at a decoder, wherein the miscorrection indicates that a number of errors in the first constituent codeword is higher than a correction capability of the product code, wherein the miscorrection avoidance procedure comprises at least one of:
performing one or more exclusive OR (XOR) operations on the first set of data to generate at least an additional data bit and generating the first constituent codeword by protecting the first set of data and the additional data bit with parity bits, wherein the first constituent codeword generated based on the one or more XOR operations comprises the first set of data, the additional data bit, and the parity bits, or
extending the first Galois field corresponding to the product code to a second Galois field, wherein an order of the second Galois field is greater than an order of the first Galois field, wherein the first constituent codeword generated based on the extending of the first Galois field comprises the first set of data and an additional parity bit that corresponds to the order of the second Galois field;
generate the first constituent codeword based on performing the miscorrection avoidance procedure;
generate the second constituent codeword that protects the data bit included in the first set of data of the first constituent codeword; and
store the first constituent codeword and the second constituent codeword in a memory.

19. The non-transitory processor-readable medium of claim 18, wherein the miscorrection avoidance procedure comprises performing the one or more XOR operations on a second set of data to be encoded in a third constituent codeword of the product code, wherein the additional data bit is included in the first constituent codeword but not the third constituent codeword.

20. The non-transitory processor-readable medium of claim 18, wherein the first constituent codeword has a first set of parameters that comprise a length of n, k data bits, and a t error correction capability, wherein the first Galois field has a $2^P$ order, wherein the second Galois field has a $2^{P+1}$ order, and wherein extending the first Galois field to the second Galois field comprises changing the first set of parameter to a second set of parameters that comprise a length of n+t, the k data bits, and the t error correction capability.

* * * * *